United States Patent [19]

Hogg

[11] Patent Number: 4,803,442
[45] Date of Patent: Feb. 7, 1989

[54] LOW POWER BUFFER AMPLIFIER
[75] Inventor: Dennis Hogg, Moorpark, Calif.
[73] Assignee: Micropolis Corporation, Chatsworth, Calif.
[21] Appl. No.: 120,610
[22] Filed: Nov. 16, 1987
[51] Int. Cl.[4] .............................................. H03F 3/26
[52] U.S. Cl. ..................................... 330/274; 330/296
[58] Field of Search ............... 330/269, 274, 296, 268, 330/273

[56] References Cited
FOREIGN PATENT DOCUMENTS
0012545 1/1977 Japan .................................... 330/269

Primary Examiner—Gene Wan
Attorney, Agent, or Firm—Poms, Smith, et al.

[57] ABSTRACT

A current amplifier is provided with three active transistors of the same polarity type, which function to amplify the input signal at a wide range of frequencies, with low power consumption and low or no output crossover distortion. One transistor, in cooperation with the second transistor, significantly amplifies the current during one swing of the input singal while the third transistor is switched off, and switches on the third transistor just prior to a reversal of the input signal swing. By the proper and immediate biasing of the third transistor according to the circuit needs, low power consumption as well as low or zero output crossover distortion is achieved.

23 Claims, 1 Drawing Sheet

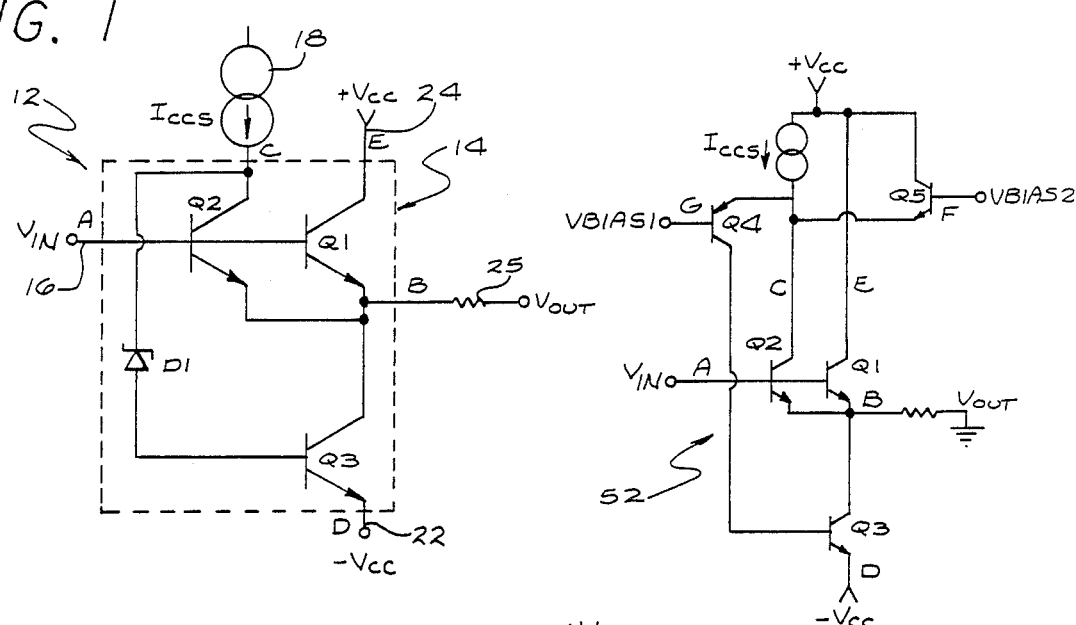
FIG. 1
FIG. 2
FIG. 3
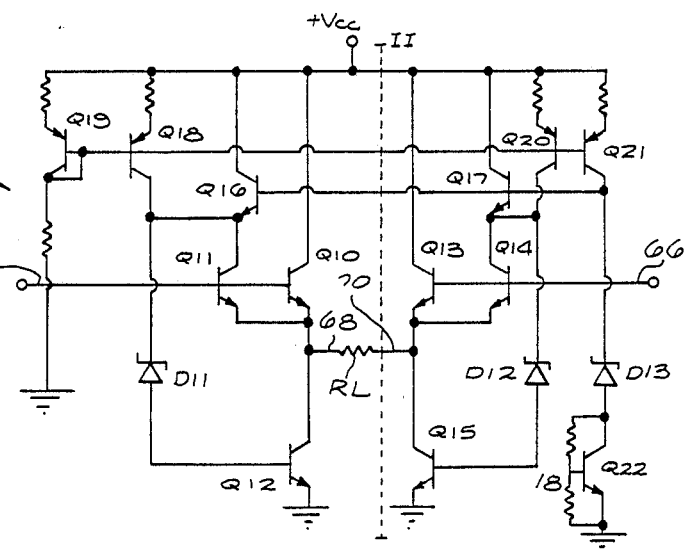
FIG. 4

4,803,442

LOW POWER BUFFER AMPLIFIER

FIELD OF THE INVENTION

This invention relates to current amplifiers.

BACKGROUND OF THE INVENTION

Traditionally, the predominately used analog signal amplifiers have been the Class A, Class B and Class AB amplifiers, with class A amplifiers operating in the linear amplification region of a single transistor, class B amplifiers using two transistors, one for amplifying positive-going signals and the other for amplifying negative-going signals, and class AB amplifiers being a hybrid. A few of the desirable characteristics of an amplifier are high gain factor, low power consumption, low or no output signal distortion, and a large bandwidth.

The active components of a typical Class A amplifier include a single transistor which amplifies the input signal, and a resistor which provides for proper biasing of the circuit and shunts the emitter current to ground. The major drawback of the Class A amplifier is the excessive power consumption in the amplifier circuitry, required to bias the amplifying transistor to its linear operating point.

In a typical Class A amplifier, the bias current is always on, and is larger than the load current. The excessive current is dissipated within the amplifier circuitry, causing high power consumption. The high power consumption of a Class A amplifier becomes extremely undesirable when the amplifier is included within an integrated circuit chip.

The active components of a typical Class B amplifier include an NPN and a PNP transistor, wherein the emitters of the two transistors are connected. The NPN transistor amplifies the input signal during the positive swing of the signal, and the PNP transistor amplifies the input signal in its negative swing. Two major drawbacks of the Class B amplifier are high output distortion at the crossover point, and slower circuit operation. The slower circuit operation is due to the use of a PNP transistor which is normally slower in operation than an NPN transistor in the normal integrated circuit configuration.

The crossover distortion results from a lack of coincidence of the transistor characteristics of the NPN and the PNP transistors at the crossover point. In a typical operation, a change in voltage of 1.4 volts is required from the point that one transistor has been switched off to the point when the other transistor is switched on. Meanwhile, during this period, neither the NPN or the PNP transistor is active, resulting in distortion of the output signal.

The normally required 1.4 volts change in voltage Q may be reduced by using other devices, such as operational amplifiers in connection with the classic Class B circuitry, or by providing bias current, thereby shifting to class AB operation. Although such attempts have resulted in a reduction in crossover distortion, the resulting circuit has the major drawbacks of higher power consumption and more complex circuitry.

The active components of a typical Class AB amplifier may include the same active components as in a Class B amplifier, as well as other components such as diodes, resistors and transistors, with increased bias current for the two transistors to reduce crossover distortion. Similar to a Class B amplifier, a Class AB amplifier provides bidirectional output swings. Functionally, the Class AB amplifier may be viewed as a hybrid between the Class A and the Class B amplifiers. With an increase in power consumption, the Class AB amplifier may achieve a lower crossover distortion and higher speed than that of a Class B amplifier. The obvious disadvantage, however, would be an undesirably high power consumption. Further, the crossover distortion is increased and the speed is decreased as the bias current into the circuit is decreased.

Therefore, the Class AB amplifier provides the user with a compromise between low power consumption on one hand and low crossover distortion and high speed on the lQ other hand. Further, the crossover distortion, in a Class B or a Class AB amplifier, is accentuated as the circuit operates at higher frequencies.

Accordingly, the principal object of the present invention is to provide a high speed, high gain amplifier circuit to accomplish current amplification at a wide range of input signal frequencies, while keeping the power consumption at a minimal level and achieving minimal or no crossover distortion.

SUMMARY OF THE INVENTION

The active components of an amplifier in accordance with the present invention may simply include three transistors and a voltage-level shifter device, such as a zener diode, a transistor or a resistor. The base and emitter of first transistor are directly connected to the base and emitter of second transistor, respectively, resulting in an identical voltage across the base and emitter of these two transistors. Further, the emitter of the first transistor and the emitter of the second transistor are both directly connected to the collector of the third transistor. The voltage-level shifter connects the collector of the second transistor to the base of the third transistor.

Only five externally accessible leads need be provided for full external access to the amplifier circuitry. Three of these external leads are used as biasing terminals, one is used for applying a constant current source to the collector of the second transistor, another being used for applying a DC-biasing potential to the collector of the first transistor, and yet another being used for applying a DC-biasing potential to the emitter of the third transistor.

Normally, the first and second transistors operate together to amplify the current during swings of one polarity of the input signal, while the third transistor amplifies the current during swings in the opposite direction (with respect to the crossover point) of the input signal.

An amplifier in accordance with the present invention consumes low power due to the controlling characteristics of the second transistor for switching on or off the third transistor, depending upon circuit operation.

The third transistor is switched off when the first and second transistors are in the full amplification mode. At this stage, the second transistor, due to its significantly high current gain, consumes all of the current supplied by the constant current source. As a result, no current flows, through the voltage-level shifter device, to the base of the third transistor. With no biasing current flowing to its base, the third transistor is switched off.

As the input signal reaches the crossover point, the second transistor consumes less current than is supplied by the constant current source. As a result, some of the current flows to the base of the third transistor, causing it to be biased on. With the third transistor biased on, all of the current that is conducted by the first and second transistors is conducted through the third transistor. As the input signal goes beyond the crossover point, the second transistor consumes less current from the constant current source, allowing more current to be conducted to the base of the third transistor, causing a significantly greater current gain in the third transistor. Since at this point the current conducted by the first and second transistors does not meet the current demand of the third transistor, a significant amount of current is conducted through the load circuitry. As a result, the bias current is much less IQ than the load current throughout the operation of the circuit, resulting in very efficient power utilization.

In addition to a significantly low power consumption, the circuit also substantially eliminates crossover distortion of the output signal. The low crossover distortion is achieved because the usual requirement in a class B amplifier for a 1.4 volts voltage change in the input signal, to continue with the amplification, is significantly reduced. This is accomplished by keeping the first transistor biased on throughout the whole cycle.

To further reduce the crossover distortion, a voltage clamping device, such as a transistor, is connected to the collector of the second transistor to maintain a minimum potential at this node. As a result, the third transistor is immediately biased-on at the crossover point, thereby eliminating crossover distortion at the output.

Incidentally, field effect transistors or other similar amplifier devices may be employed, instead of bipolar transistors, to implement the present invention as set forth in greater detail hereinbelow.

Accordingly, the present invention provides a current amplifier that achieves our main objectives, namely, low power consumption and minimal or no crossover distortion. Further, the invention achieves a high and accurate current gain over a wide band of frequencies.

In addition, since transistors of the same polarity type are employed, the speed of the amplifier may be further increased by employing NPN transistors for the first, second and third transistors.

Other objects, features, and advantages of the invention will become apparent from a consideration of the following detailed description and from the accompanying drawings.

BRIEF DESCRIPTION OF THE DRAWINGS

FIG. 1 is a schematic drawing of a first exemplary embodiment of a current amplifier illustrating the principles of the present invention;

FIG. 2 is a schematic drawing of a second exemplary embodiment of a current amplifier, modified to further reduce crossover distortion;

FIG. 3 is a schematic drawing of an alternative embodiment of the invention; and FIG. 4 is a more detailed schematic circuit diagram, showing a differential mode amplifier, integrated circuit implementation.

DETAILED DESCRIPTION

Referring more particularly to the drawings, FIG. 1 is a schematic circuit diagram of a first exemplary embodiment of the new low power, low crossover distortion and high speed amplifier 12. The active components of amplifier 12 may be fabricated on a single integrated circuit semiconductor wafer 14 (using conventional integrated circuit layout and construction techniques) and connected to external circuitry by only five terminals (i.e., IC "pads") A, B, C, D, and E. In the preferred embodiment, terminal A is an input lead, terminal B is an output lead, terminal C is connected to a constant current source 18, terminal D, also designated by reference numeral 22, is connected to a potential source designated −Vcc, and terminal E or 24 is connected to a potential source +Vcc.

Because of the small number of leads required to connect the components fabricated on wafer 14 with external components, amplifier 12 can be produced using a small chip package.

Three transistors Q1, Q2 and Q3 and a zener diode D1 make up the active elements of amplifier 12. Although all of the transistors shown in FIG. 1 are NPN bipolar junction transistors, PNP bipolar transistors, (as shown in FIG. 3) or field effect transistors (FET) could be used instead (in the latter instance, base, collector, and emitter become gate, drain, and source structures, respectively). In FIG. 1, the collector of transistor Q1 is connected to terminal E which has a positive biasing potential +Vcc applied to it, while the emitter of transistor Q1 is connected to the output terminal B. The collector of transistor Q2 is connected to terminal C which is connected to the constant current source 18 also designated as Iccs, while the emitter of transistor Q2 is connected to the output terminal B.

The collector of transistor Q3 is connected to the output terminal B, while the emitter of transistor Q3 is connected to terminal D which has a negative biasing potential −Vcc or may have a potential of ground applied to it. The base of transistor Q2 is connected to the base of transistor Q1, while the emitter of transistor Q2 is connected to the emitter of transistor Q1 and to the collector of transistor Q3. The zener diode D1, which could be replaced by any voltage-level shifter device, such as a transistor or a resistor, is connected between the collector of transistor Q2 and the base of transistor Q3.

The zener diode D1, or a functionally equivalent component, provides for a voltage level shift between the base of transistor Q3 and the collector of transistor. This level shift allows transistor Q2 to operate in full current amplification mode, consuming all of the current supplied by constant current source 18, for a greater range of input signal values applied to input lead 16. In case of a zener diode, this shift in voltage level is approximately equal to the breakdown voltage of the zener diode.

In a typical application, the DC potential +Vcc applied to terminal E is more positive than DC potential applied to input terminal A, and the DC potential at input terminal A is more positive than the DC biasing potential 22 applied to terminal D. With such an arrangement, transistor Q1 is biased on at all times. Any of these DC biasing potentials may be set to ground potential, with the other potentials having an appropriate magnitude and sign relative to the point which is biased to ground potential.

When the AC input signal applied to input 16 is in the positive range, or is above the crossover point, transistor Q1 as well as transistor Q2 significantly amplify the current, and the circuit is said to be "sourcing current" to the output terminal B. In this mode, transistor Q2 conducts all of the current that is supplied by the constant current source 18. Since the voltage across the base and emitter of transistors Q2 and Q1 are equivalent (they are connected together), transistor Q1 will also be drawing significant amount of current, normally larger than the current conducted by transistor Q2, from terminal E, with the amount of current that is conducted by the transistor Q2 being limited to the amount of current supplied by the constant current source 18. With transistor Q2 consuming all of the current that is supplied by the constant current source 18, no current flows through the diode D1 to the base of transistor Q3, and transistor Q3 is therefore biased off. With transistor Q3 biased off, the current at the emitter electrodes of transistors Q1 and Q2 combine and flow into the output terminal B.

In this mode of operation, with transistors Q1 and Q2 significantly amplifying the current, and transistor Q3 being biased off, the circuit "sources" a significant amount of current to the output terminal B It is noted that virtually all of the current produced by transistors Q1 and Q2 is "sourced" to the load, and a 1Q minimal amount of current is wasted in the circuitry itself because transistor Q3 is biased off. A circuit in accordance with the present invention, unlike a typical Class A amplifier, amplifies the input current signal during both positive and negative swings of the input signal without a need to superimpose the varying input current signal onto a large DC current. As a result, and for other reasons which will be discussed below, the power utilization of a circuit in accordance with the present invention is significantly more efficient than the power utilization in a typical Class A amplifier.

The circuit in FIG. 1 also avoids, to a significant degree, crossover distortion in the output signal, by keeping transistors Q1 and Q2 on at all times. As the input signal 16 approaches the crossover point, the amount of current drawn by transistor Q2, from the constant current source 18, is reduced. When the input signal 16 reaches the crossover point, the amount of current drawn by the collector of transistor Q2 has dropped below the amount of current supplied by the constant current source 18, thereby allowing some of the current to pass through the zener diode D1 to the base of transistor Q3. Incidentally, although transistors Q1 and Q2 are conducting, the current conducted by is less than that provided by the current source 18.

The current supplied to the base of transistor Q3 is sufficient to bias transistor Q3 on. With transistor Q3 being biased on, the current at the emitter of transistors Q2 and Q1 will be shunted through transistor Q3. At this stage, virtually no load current is being supplied by the circuit.

As the input signal 16 drops to values below the crossover point, the current gain of transistors Q2 and Q1 significantly drops, and therefore, more current is supplied, from the constant current source 18, to the base of transistor Q3. With an increase in its base current, transistor Q3 significantly conducts more current. Since transistor Q3, at this instance, "sinks" more current than is supplied to it by transistors Q1 and Q2, the rest of the current is drawn from the load circuitry. The amplifier circuit 12, at this instant, is said to be "sinking current" or "pulling current" from the load 25. In one sense transistor Q3 may be viewed as a variable current sink, which is controlled by the input signal 16.

FIG. 2 is a schematic diagram of another, further improved embodiment of the present invention. In addition to having all of the advantages of the circuit in FIG. 1, the circuit in FIG. 2 has the further advantage of eliminating residual crossover distortion in the output signal. The embodiment shown in FIG. 2 is identical with the embodiment shown in FIG. 1 except that transistor Q5 has been added, and the zener diode D1 has been replaced by a functionally equivalent, PNP bipolar junction transistor Q4. As mentioned above, the zener diode D1 in FIG. 1, or transistor Q4 in FIG. 2 (zener diode D1 of FIG. 1 may replace transistor Q4 of FIG. 2 for a faster operation), provide a voltage-level shift between the base of transistor Q3 and collector of transistor Q2. Transistor Q4, or a functionally equivalent device, provides for proper biasing of transistor Q3, as well as providing for proper operation of the circuit in FIG. 2 for a greater range of input signal values.

The transistor Q5 functions to maintain the voltage seen at the collector of transistor Q2, above a minimum level which is set equal to the base voltage of transistor Q5 less the voltage drop across the base and emitter of transistor Q5. By maintaining the voltage at the collector of transistor Q2 close to the voltage needed to switch transistor Q4 on, transistor Q4 is switched on faster as the input signal 16 nears the crossover point. With transistor Q4 being switched on, some of the current from the constant current source 18 flows to the base of transistor Q3, causing transistor Q3 to be biased on. With transistor Q3 biased on just before the input signal 16 reaches the crossover point, current amplification is continued without any delay in the output waveform, thereby eliminating crossover distortion in the output.

One example of how the circuit of FIG. 2 operates, in a complete cycle, to eliminate crossover distortion while still achieving low power consumption is set forth as follows.

The biasing potentials +Vcc and −Vcc are set to +10 and −10 volts, respectively. The DC biasing voltage applied to input terminal A is zero volts. The potentials applied to the base of transistors Q4 and Q5 are +8 and +9 volts, respectively.

When the AC input voltage Vin is on a positive polarity swing, transistors Q2 and Q1 are fully conducting. Transistor Q5 is conducting, resulting in approximately 8.3 volts potential at the emitter of transistor Q4. Since the base voltage of transistor Q4 is set to 8 volts, a voltage of 8.3 at the emitter of this transistor causes it to be biased off because the required threshold voltage of approximately 0.7 volts, to bias transistor Q4 on, across the base and emitter of the transistor is not satisfied. With transistor Q4 being biased off, no current is conducted to the base of transistor Q3 causing it to be biased off.

As the AC input voltage Vin approaches the crossover point, of zero volts, the transistor Q2 conducts less current because the voltage across the load approaches zero. With load current approaching smaller values, the current at the collector of transistor Q2 significantly decreases in magnitude. Thus less current is conducted from the current source Icss and transistor Q5, resulting in an increase in the emitter voltage of transistor Q5 to approximately 8.7 volts. Transistor Q5 is thus biased off. The voltage increase at the emitter of transistor Q4 from 8.3 to 8.7 volts causes it to be biased on. If instead of transistor Q4, a zener diode such as diode D1 was used in the circuit of FIG. 2, a breakdown voltage, for the zener diode, of approximately 18 volts would be required for proper operation. With transistor Q4 being biased on, some of the current supplied by the constant current source Icss is conducted to the base of Q3 causing it to be biased on. Transistor Q3 continues active operation throughout the time that the input signal is in its negative swing. During this time, transistor Q3 amplifies the current according to the magnitude of the current conducted to its base. Since the amount of current conducted to the base of transistor Q3 varies according to the input signal, transistor Q3 operates in a sense as a varying current source. The magnitude of the current into the collector of Q3 will be greater than the load current so that transistors Q1 and Q2 will always be biased on.

As the input signal swings positive again, above the zero volt crossover point, transistor Q2 conducts more current. Slightly above the input crossover point, transistor Q2 conducts all of the current that is supplied by the constant current source Icss causing transistor Q4 to be biased off. With transistor Q4 being biased off, the current supply to the base of transistor Q3 is cut off, causing transistor Q3 to be biased off.

With the above configuration, the input positive swing may be as high as +8 volts, and the input negative swing may be as low as −9.0 volts.

The circuit in FIG. 2 with a zener diode instead of transistor Q4 has been tested in the frequency range of about 10 Kilohertz to 50 Megahertz, and has displayed excellent gain, with almost no crossover distortion and low power consumption.

FIG. 3 is a schematic drawing of an alternative embodiment of the present invention using PNP transistors instead of NPN transistors. As illustrated in FIG. 3, PNP transistors Q6, Q7, and Q8 are employed instead of the three NPN transistors Q1, Q2 and Q3, respectively, of FIG. 1. Further, the direction of the constant current source 18 in FIG. 1 is reversed, and the two DC biasing potential nodes applied to the emitter of transistor Q3 and the collector of transistor Q1 have changed signs. In addition, the direction or polarity of the zener diode D1 has also been changed.

In the circuit of FIG. 3, transistor Q8 sources current to the output terminal 36 when the input signal 30 is positive, and transistors Q7 and Q6 sink the current when the input signal when the input signal 30 is in the negative swing. Further, the biasing potential at the terminal 38 is more positive than the biasing potential at terminal 30 which in turn is more positive than the biasing potential at terminal 34.

As mentioned hereinabove, field effect transistors may also be employed instead of the NPN or the PNP transistors, and the zener diode D1 may be replaced by another component, such as a resistor or a transistor, which functions to shift the voltage level.

Further, some of the external circuitry, such as the constant current source may be integrated with the rest of the circuit components, into one monolithic circuit. FIG. 4 is one such circuit, and represents a more detailed schematic drawing, illustrating an arrangement wherein the active components, as well as some of the external circuitry are arranged in a differential mode amplifier integrated circuit 60. Differential mode operation of the circuit results in a lower noise level in the output signal.

The operation of the circuit in FIG. 4 is similar to the operation of the circuit in FIG. 2, with the exception that as noted above the circuit in FIG. 4 operates in differential mode. A differential mode amplifier, such as circuit 60, normally includes two functionally equivalent halves.

The input signal is applied across terminals 64 and 66. The output signal is applied across the resistor RL. Transistors Q10, Q11 and Q12, to the left of line II, and transistors Q13, Q14 and Q15, to the right of line II, function in a manner similar to transistors Q1, Q2 and Q3, respectively, in circuit 52 of FIG. 2. Zener diode D11, to the left of line II, and zener diode D12, to the right of line II, function in a manner similar to zener diode D1 in FIG. 1. Diodes D11 and D12 perform as voltage-level shifters to increase the voltage at the collector of transistors Q11 and Q14, respectively. Transistors Q16 and Q17 are voltage clamping transistors provided for maintaining, above a certain level, the voltage at the collector nodes of transistors Q11 and Q14, respectively.

Transistors Q19 and Q18 form a current mirror whereby transistor Q18 provides a constant flow of current to the collector node of Q11, and wherein the current level is determined by the resistors associated with control transistor Q19 to which transistor Q18 is tied. Equivalently, transistors Q19 and Q20 function as a current mirror, whereby transistor Q20 provides a constant flow of current to the collector of transistor Q14.

Transistors Q21 and Q22 and diode D13 function to provide a sufficient base voltage to transistors Q16 and Q17. The resistors associated with the transistors provide for an appropriate biasing of the circuit components. As mentioned above, field effect transistors or other similar semiconductor devices may be employed, instead of bipolar transistors, to implement the present invention. In such a configuration, the base, collector, and emitter become gate, drain, and source structures, respectively.

To implement the circuit 12 of FIG. 1 using field effect transistors (FET), transistors Q1, Q2 and Q3 may be replaced by first, second and third field effect transistors, respectively. In this configuration, the input signal is applied to the gate of the first and second transistors, while biasing potential +Vcc is applied to the drain of the first transistor, and constant current source Iccs is applied to the drain of the second transistor. The source of the first and second field effect transistors are directly connected to the drain of the third field effect transistor, while a biasing potential −Vcc is applied to the source of the third transistor. A voltage level shifting device, such as a zener diode, may be employed to connect the gate of the third transistor to drain of the second transistor.

Accordingly, in the FET implementation of the invention as described hereinabove, the drain electrodes of the first and second transistors are biasing electrodes, the gate electrode of the first, second and third transistor are input electrodes, the source electrode of the first and second transistor are output electrodes, the drain electrode of the third transistor is an output electrode, and the source electrode of the third transistor is a biasing electrode.

Similarly, in the bipolar implementation of the invention as described hereinabove, the collector electrodes of the first and second transistors are biasing electrodes, the base electrodes of the first, second and third transistor are input electrodes, the emitter electrodes of the first and second transistor are output electrodes, the collector electrode of the third transistor is an output electrode, and the source electrode of the third transistor is a biasing electrode.

In conclusion, it is to be understood that the foregoing detailed description and the accompanying drawings illustrate the principles of the invention. However, various changes may be made without departing from the spirit and scope of the invention. Thus by way of example and not of limitation, the zener diode D1 of FIG. 1 may be replaced with a resistor or a transistor, such as a PNP transistor, or combination thereof; the transistors Q1, Q2 and Q3 may be replaced by PNP transistors (as illustrated in FIG. 3), or by FET transistors; transistor Q5 of FIG. 2 may be replaced by other voltage clamping devices; and the constant current source Icss may be integrated into the amplifier circuit to form a monolithic integrated circuit amplifier. Also, the use of the clamp, such as transistor Q5 of FIG. 2 is independent of the type of level shifter employed. Accordingly, the present invention is not limited to the circuits shown in the drawings and described in detail hereinabove.

What is claimed is:

1. A high efficiency, low crossover distortion, current amplifier circuit comprising:
    a first transistor having a base, an emitter and a collector;
    a second transistor having a base directly connected to the base of said first transistor, an emitter directly connected to the emitter of said first transistor, and a collector;
    means for applying an input signal to the base electrodes of said first and second transistors;
    a third transistor having a base, an emitter, and a collector which is directly connected to the emitters of said first and second transistors;
    said first, second and third transistors all being of the same polarity type;
    constant current source means for supplying current to the collector of said second transistor, and to the base of said third transistor;
    DC biasing means for applying a potential to the collector of said first transistor;
    DC biasing means for applying a potential to the emitter of said third transistor; and
    voltage-level shifting means for biasing said third transistor off when said second transistor is substantially conducting and consumes all of the current from the constant current source, and for biasing said third transistor on when said second transistor is not fully conducting and does not consume all of the current from the constant current source;
    whereby said first and second transistors are in full amplification mode during one polarity swing of the input signal, and said third transistor is in full amplification mode during the opposite polarity swing of the input signal, resulting in a low power consumption as well as low crossover distortion.

2. An amplifier as defined in claim 1 wherein said first, second and third transistors are bipolar NPN transistors.

3. An amplifier as defined in claim 1 wherein said voltage-level shifting means includes a zener diode.

4. An amplifier as defined in claim 1 further comprising:
    voltage clamping means for maintaining the collector voltage of said second transistor above a minimum level; whereby the crossover distortion is diminished to zero.

5. An amplifier as defined in claim 4 wherein said first, second and third transistors are bipolar NPN transistors, and said clamping means includes a bipolar NPN transistor.

6. An amplifier as defined in claim 4 wherein said first, second and third transistors are bipolar PNP transistors, and said clamping means includes a bipolar PNP transistor.

7. An amplifier as defined in claim 6 wherein said voltage-level shifting means includes a zener diode.

8. An amplifier as defined in claim 5 wherein said voltage-level shifting means includes a zener diode.

9. An amplifier as defined in claim 5 wherein said voltage-level shifting means includes a PNP transistor.

10. An amplifier as defined in claim 6 wherein said voltage-level shifting means includes a bipolar NPN transistor.

11. An amplifier as defined in claim 5 wherein said voltage-level shifting means includes a resistor.

12. A high efficiency, low crossover distortion current amplifier circuit comprising:
    a first transistor having a base, an emitter and a collector;
    a second transistor having a base directly connected to the base of said first transistor, an emitter directly connected to the emitter of said first transistor, and a collector;
    means for applying an input signal to the base electrodes of said first and second transistors;
    a third transistor having a base, an emitter and a collector which is directly connected to the emitter of said first and second transistors;
    said first, second and third transistors all being of the same polarity type;
    constant current source means for supplying current to the collector of said second transistor, and to the base of said third transistor;
    voltage clamping means for maintaining the collector voltage of said second transistor above a minimum level;
    DC biasing means for applying a potential to the collector of said first transistor;
    DC biasing means for applying a potential to the emitter of said third transistor; and
    voltage-level shifting means for biasing said third transistor off when said second transistor consumes all of the current from the constant current source, and for biasing on said third transistor when said second transistor does not consume all of the current from the constant current source; whereby low power consumption is achieved, and crossover distortion is diminished.

13. An amplifier as defined in claim 12 wherein said first, second and third transistors are bipolar NPN transistors.

14. An amplifier as defined in claim 13, wherein said clamping means for maintaining the collector voltage of said second transistor includes a bipolar NPN transistor.

15. An amplifier as defined in claim 14 wherein said voltage-level shifting means includes a zener diode.

16. An amplifier as defined in claim 14 wherein said voltage-level shifting means includes a resistor.

17. An amplifier as defined in claim 14 wherein said voltage-level shifting means includes a PNP transistor.

18. An amplifier as defined in claim 12 wherein said first, second and third transistors are bipolar PNP transistors, and said means for maintaining the collector voltage of said second transistor includes a bipolar PNP transistor.

19. An amplifier as defined in claim 18 wherein said voltage-level shifting means includes a zener diode.

20. A monolithic integrated circuit amplifier as defined in claim 12 further comprising:
- a fourth transistor having a base, an emitter and a collector;
- a fifth transistor having a base directly connected to the base of said fourth transistor, an emitter directly connected to the emitter of said fourth transistor, and a collector;
- means for applying an input signal to the base electrodes of said fourth and fifth transistors;
- a sixth transistor having a base, an emitter and a collector which is directly connected to the emitter of said fourth and fifth transistors;
- said fourth, fifth and sixth transistors all being of the same polarity type and functionally identical to said first, second and third transistors, respectively;
- a second constant current source means for supplying current to the collector of said fifth transistor, and to the base of said sixth transistor;
- voltage clamping means for maintaining the collector voltage of said fifth transistor above a minimum level;
- DC biasing means for applying a potential to the collector of said fourth transistor;
- DC biasing means for applying a potential to the emitter of said sixth transistor; and
- voltage-level shifting means for biasing said sixth transistor off when said fifth transistor consumes all of the current from the second constant current source, and for biasing said sixth transistor on when said fifth transistor does not consume all of the current from the second constant current source;
- whereby the circuit operates in differential mode to further reduce the noise, while still achieving low power consumption and zero or no crossover distortion, at a wide band of input signal frequencies.

21. A high efficiency, low crossover distortion, integrated circuit current amplifier circuit comprising:
- a first transistor having a biasing electrode, an input electrode and an output electrode;
- a second transistor having a biasing electrode, an input electrode directly connected to the input electrode of said first transistor, and an output electrode directly connected to the output electrode of said first transistor;
- means for applying an input signal to the input electrodes of said first and second transistors;
- a third transistor having an input electrode, a biasing electrode, and an output electrode which is directly connected to the output electrodes of said first and second transistors;
- said first, second and third transistors all being of the same polarity type;
- constant current source means for supplying current to the biasing electrode of said second transistor, and to the input electrode of said third transistor;
- DC biasing means for applying a potential to the biasing electrode of said first transistor;
- DC biasing means for applying a potential to the biasing electrode of said third transistor; and
- voltage-level shifting means for biasing said third transistor off when said second transistor is substantially conducting and consumes all of the current from the constant current source, and for biasing said third transistor on when said second transistor is not fully conducting and does not consume all of the current from the constant current source;
- whereby said first and second transistors are in full amplification mode during one polarity swing of the input signal, and said third transistor is in full amplification mode during the opposite polarity swing of the input signal, resulting in a low power consumption as well as low crossover distortion.

22. An amplifier as defined in claim 21 wherein said first, second and third transistors are field effect transistors, said input electrodes of said first, second and third transistors are gate electrodes, said output electrodes of said first and second transistors are source electrodes, said biasing electrodes of said first and second transistors are drain electrodes, said biasing electrode of said third transistor is the source electrode and said output electrode of said third transistor is the drain electrode.

23. An amplifier as defined in claim 20 wherein said first, second and third transistors are bipolar transistors, said input electrodes of said first, second and third transistors are base electrodes, said output electrodes of said first and second transistors are emitter electrodes, said biasing electrodes of said first and second transistors are collector electrodes, said biasing electrode of said third transistor is the emitter electrode and said output electrode of said third transistor is the collector electrode.

* * * * *